United States Patent
Hung et al.

(10) Patent No.: US 9,659,794 B2
(45) Date of Patent: May 23, 2017

(54) PARTICLE IMPROVEMENT FOR SINGLE WAFER APPARATUS

(71) Applicant: TAIWAN SEMICONDUCTOR MANUFACTURING CO., LTD., Hsinchu (TW)

(72) Inventors: Ming-Sung Hung, Taichung (TW); Yu-Kuei Lee, Taichung (TW); Cheng-Nan Kao, Changhua County (TW); Hung-Hsin Liang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 106 days.

(21) Appl. No.: 14/455,761

(22) Filed: Aug. 8, 2014

(65) Prior Publication Data

US 2016/0040286 A1  Feb. 11, 2016

(51) Int. Cl.
*H01L 21/304* (2006.01)
*H01L 21/67* (2006.01)

(52) U.S. Cl.
CPC .............................. *H01L 21/67017* (2013.01)

(58) Field of Classification Search
None
See application file for complete search history.

(56) References Cited

U.S. PATENT DOCUMENTS

| 2013/0171831 A1* | 7/2013 | Namba | H01L 21/32134 |
| | | | 438/748 |
| 2013/0220478 A1* | 8/2013 | Kasahara | H01L 21/67017 |
| | | | 141/2 |

FOREIGN PATENT DOCUMENTS

JP  58086463  * 11/1984

* cited by examiner

*Primary Examiner* — Michael Barr
*Assistant Examiner* — Jason Riggleman
(74) *Attorney, Agent, or Firm* — McDermott Will & Emery LLP

(57) ABSTRACT

An apparatus includes a susceptor, a first piping, a second piping, a liquid source, a third piping and a gas source. The susceptor is suitable for placing a wafer, and the first piping is configured to dispense a chemical to the wafer on the susceptor. The second piping communicates with the first piping. The liquid source is configured to deliver a cleaning liquid to the first piping through the second piping to wash a portion of the first piping. The third piping communicates with the first piping. The gas source is configured to flow a purge gas to the first piping through the third piping to purge the portion of the first piping.

17 Claims, 3 Drawing Sheets

Figure 1:
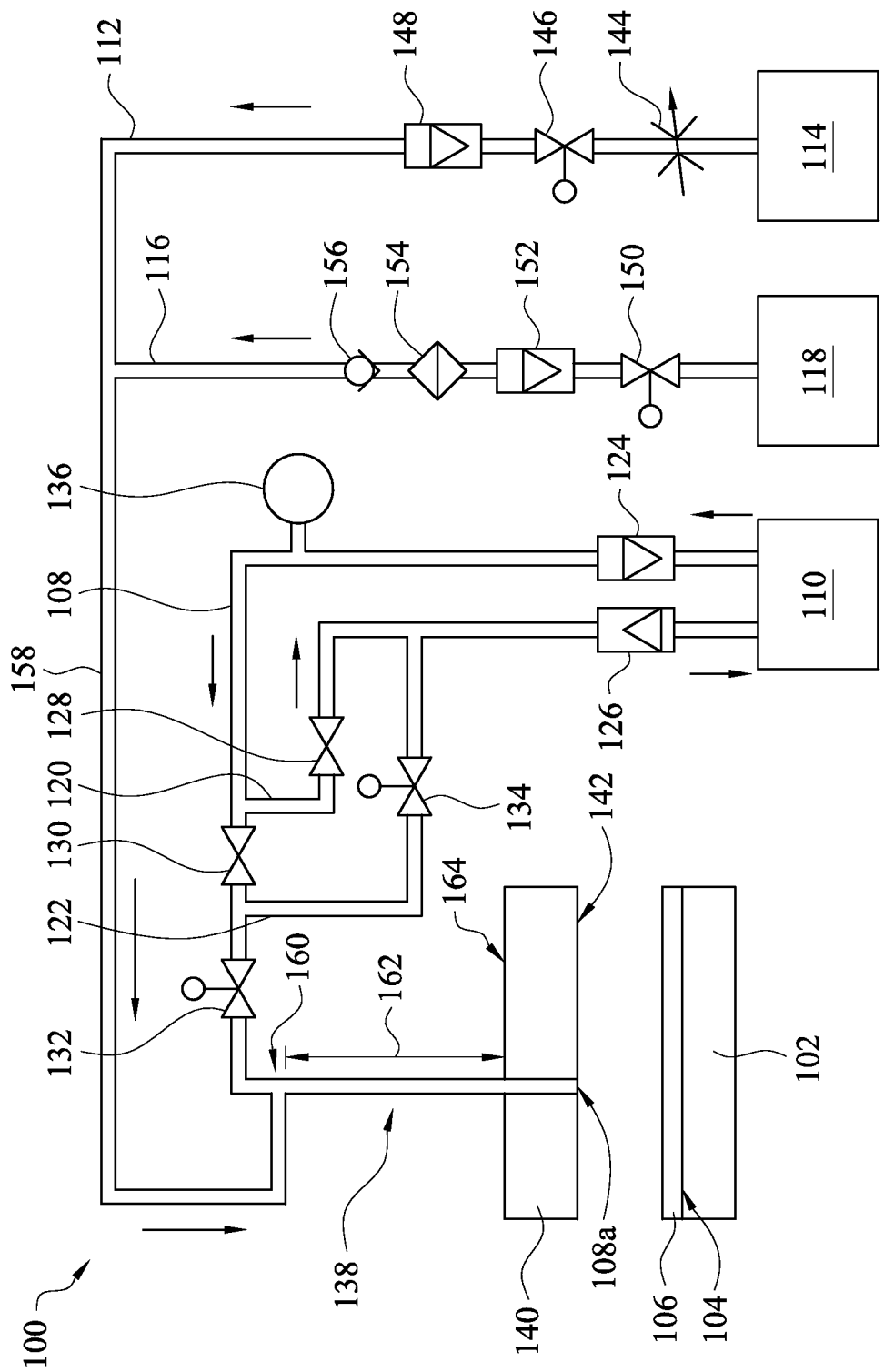

PARTICLE IMPROVEMENT FOR SINGLE WAFER APPARATUS

BACKGROUND

As semiconductor technology develops, the sizes of wafers are constantly increasing. The wafers with larger diameters make it possible to produce more semiconductor devices from a single wafer, and thus productivity and economic efficiency are significantly enhanced. In semiconductor manufacturing, various wet processes are performed on the wafers to remove portions of deposited material layers for patterning or to remove contaminants and particles on the wafers for cleaning. As the sizes of the wafers are continuously increased, batch type wet processing tools are gradually replaced by single wafer wet processing tools because the batch type wet processing tools for the large wafers become cumbersome, and the single wafer wet processing tools can offer better process control, lower cost and shorter cycle time.

However, while conventional single wafer wet processing tools have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is schematic diagram showing an apparatus in accordance with various embodiments.

FIG. 2 is schematic diagram showing an apparatus in accordance with various embodiments.

FIG. 3 is a flow chart of a method in accordance with various embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a wet processing of wafers with phosphoric acid ($H_3PO_4$), when a wet processing tool is idle exceeding a predetermined period of time, several dummy flush treatments are performed in the wet processing tool before the first one of the wafers to be processed is loaded into the wet processing tool. With the dummy flush treatments, the number of particles remaining on the processed wafer can be reduced to an acceptable degree. However, each dummy flush treatment consumes one dummy wafer, some phosphoric acid and water, and it takes a lot of time for all dummy flush treatments to be performed. Therefore, the pre-treatment of the wet processing tool is costly and time-consuming.

Embodiments of the present disclosure are directed to providing apparatuses and methods for reducing particles remaining on wafers after a wet processing operation within a single wafer tool, in which a cleaning liquid is supplied to a chemical piping through a liquid piping to wash a portion of the chemical piping, and a purge gas is supplied to the chemical piping through a gas piping to purge the portion of the chemical piping before the first one of wafers is loaded into the single wafer tool while a dummy wafer is placed on a susceptor of the single wafer apparatus. The portion of the chemical piping is washed by the cleaning liquid and purged by the purge gas, so that particles and crystals in the portion of the chemical piping can be effectively decreased, thereby reducing condense defects on the wafers due to the dripping from the chemical piping. Furthermore, a cleaning ring is disposed on a cup enclosing the susceptor, and a cleaning fluid is injected from the cleaning ring toward an edge of a heating plate above the susceptor to wash the edge of the heating plate before the dummy wafer is placed on the susceptor. Thus, the cleanness of the edge of the heating plate is enhanced to decrease the number of particles remaining on edge portions of the wafers.

FIG. 1 is schematic diagram showing an apparatus in accordance with various embodiments. In some embodiments, an apparatus 100 is a wet processing apparatus for a single wafer. The apparatus 100, such as a phosphoric acid single wafer apparatus, disclosed herein is used as an example for explanation, and embodiments of the present disclosure are also applicable to other types of wet processing apparatuses. As shown in FIG. 1, the apparatus 100 includes a susceptor 102, a first piping 108, a second piping 112, a liquid source 114, a third piping 116 and a gas source 118. The susceptor 102 is suitable for placing a wafer 106 on its surface 104. In some examples, the susceptor 102 is a vacuum chuck which can firmly hold the wafer 106 by vacuum adsorption. In addition, the susceptor 102 may be rotatable to rotate the wafer 106 placed on the susceptor 102 during wet processing.

The first piping 108 is configured to dispense a chemical, such as phosphoric acid, to the wafer 106 on the susceptor 102. For example, the first piping 108 has a dispensing opening **108*a*, and the dispensing opening 108*a* is disposed above the wafer 106 on the susceptor 102 for dispensing the chemical from the top of the wafer 106. In various examples, the apparatus 100 further includes a chemical source 110 communicating with the first piping 108 for delivering the chemical to the first piping 108**. In some examples, the apparatus 100 includes a circulating piping 120 and an auxiliary piping 122. Two ends of the circulating piping 120 are respectively connected to the first piping 108 and the chemical source 110, and thus the chemical is delivered to the first piping 108 from the chemical source 110, and then some of the chemical is re-circulated back to the chemical source 110 through the circulating piping 120. Therefore, the chemical can be re-circulated in the first piping 108, the circulating piping 120 and the chemical source 110 when the apparatus 100 is idle.

Two ends of the auxiliary piping 122 are respectively connected to the first piping 108 and the circulating piping 120, in which the end of the circulating piping 120 connected to the first piping 108 is located before the end of the auxiliary piping 122 connected to the first piping 108, i.e. the chemical delivered to the first piping 108 from the chemical source 110 sequentially flows through the end of the circulating piping 120 connected to the first piping 108 and the end of the auxiliary piping 122 connected to the first piping 108. The auxiliary piping 122 can further deliver a portion of the chemical to the circulating piping 120 to replenish the flow rate of the chemical in the circulating piping 120.

In some examples, the apparatus 100 further includes two flow meters 124 and 126 respectively disposed on the first piping 108 and the circulating piping 120. The flow meters 124 and 126 respectively measure the flow rates of the chemical delivering from the chemical source 110 to the first piping 108 and returning to the chemical source 110 through the circulating piping 120. For example, as shown in FIG. 1, the apparatus 100 further includes two automatic valves 128 and 130 and two manual valves 132 and 134, in which the automatic valves 128 and 130 are respectively disposed on the circulating piping 120 and the first piping 108, and the automatic valve 130 is located between the end of the circulating piping 120 and the end of the auxiliary piping 122 connected to the first piping 108. The automatic valves 128 and 130 are operable to control the flow rate of the chemical flowing to the circulating piping 120. For example, the automatic valves 128 and 130 are air-operated valves. The manual valves 132 and 134 are respectively disposed on the first piping 108 and the auxiliary piping 122, and the end of the auxiliary piping 122 connected to the first piping 108 is located between the manual valve 132 and the automatic valve 130. The automatic valve 130 and the manual valves 132 and 134 are operable to control the flow rate of the chemical flowing to the auxiliary piping 122.

In certain examples, the apparatus 100 includes a thermocouple 136 disposed on the first piping 108. In the examples, the wet processing operation is performed using hot chemical, such as hot phosphoric acid, and the thermocouple 136 can measure the temperature of the chemical flowing in the first piping 108 for monitoring.

As shown in FIG. 1, the first piping 108 has a portion 138, and the dispensing opening 108a is at one end of the portion 138. The portion 138 is a downward portion of the first piping 108, and the dispensing opening 108a is at the lower end of the portion 138. Thus, a fluid in the portion 138 flows downward and is drained out of the first piping 108 from the dispensing opening 108a. In some examples, the apparatus 100 includes a heating plate 140 disposed above the susceptor 102. The heating plate 140 is operable to heat the chemical delivered by the first piping 108. The portion 138 passes through the heating plate 140, and the dispensing opening 108a is in a bottom surface 142 of the heating plate 140, so that when the chemical delivered by the first piping 108 flows through the heating plate 140, the chemical is heated by the heating plate 140.

Two ends of the second piping 112 are respectively connected to the liquid source 114 and the first piping 108, and the second piping 112 communicates with the liquid source 114 and the first piping 108. The liquid source 114 is configured to deliver a cleaning liquid to the second piping 112. The cleaning liquid is further delivered to the first piping 108 to wash the first piping 108 through the second piping 112. In some examples, the cleaning liquid is directly delivered to the portion 138 of the first piping 108 to wash the portion 138. The cleaning liquid is hot deionized water (HDIW), for example. In exemplary embodiments, the second piping 112 is formed from polyfluoroalkoxy (PFA). In addition, an inner diameter of the second piping 112 is about 4 mm, and an outer diameter of the second piping 112 is about 6 mm.

In some examples, the apparatus 100 includes an orifice 144 disposed on the second piping 112. The orifice 144 is configured to restrict and stabilize the flow rate of the cleaning liquid. In certain examples, the apparatus 100 further includes a manual valve 146 and a flow meter 148 disposed on the second piping 112, in which the orifice 144 is located between the liquid source 114 and the manual valve 146, and the manual valve 146 is located between the orifice 144 and the flow meter 148. The manual valve 146 is operable to control the flow rate of the cleaning liquid flowing to the first piping 108. The flow meter 148 measures the flow rate of the cleaning liquid delivering to the first piping 108.

Two ends of the third piping 116 are respectively connected to the gas source 118 and the first piping 108, and the third piping 116 communicates with the gas source 118 and the first piping 108. The gas source 118 is configured to flow a purge gas to the third piping 116. The purge gas further flows to the first piping 108 to purge the first piping 108. In some examples, the purge gas directly flows to the portion 138 of the first piping 108 to purge the portion 138. The purge gas is nitrogen ($N_2$), for example. In exemplary embodiments, the third piping 116 is formed from polyfluoroalkoxy. An inner diameter of the third piping 116 is about 4 mm, and an outer diameter of the third piping 116 is about 6 mm.

In some examples, the apparatus 100 includes a manual valve 150 and a flow meter 152 disposed on the third piping 116, in which the manual valve 150 is located between the gas source 118 and the flow meter 152. The manual valve 150 is operable to control the flow rate of the purge gas flowing to the first piping 108. The flow meter 152 measures the flow rate of the purge gas flowing to the first piping 108. In certain examples, the apparatus 100 includes a filter 154 and a check valve 156 disposed on the third piping 116, in which the filter 154 is located between the flow meter 152 and the check valve 156, and the flow meter 152 is located between the filter 154 and the gas source 118. The filter 154 is operable to filter the purge gas supplied by the gas source 118 to filter out contaminants and/or particles from the purge gas. The check valve 156 allows purge gas to flow through in only one direction from the gas source 118 to the first piping 108.

Referring to FIG. 1 again, in some embodiments, the apparatus 100 further includes a connecting piping 158. Two ends of the second piping 112 are respectively connected to the connecting piping 158 and the liquid source 114, and one end of the connecting piping 158 is connected to the first piping 108, so that the connecting piping 158 connects the second piping 112 to the first piping 108. Two ends of the third piping 116 are respectively connected to the connecting piping 158 and the gas source 118, and the connecting piping 158 is connected to the first piping 108, so that the connecting piping 158 connects the third piping 116 to the first piping 108. In some examples, the connecting piping 158 communicates with the first piping 108 at a pinning point 160 of the first piping 108 located above the heating plate 140. In certain examples, the pinning point 160 is adjacent to the other end of the portion 138 of the first piping 108 opposite the dispensing opening 108a to clean and purge the larger portion of the portion 138. In exemplary examples, a distance 162 between the pinning point 160 and a top 164 of the heating plate 140 ranges from about 350 mm to about 400 mm.

With the second piping 112 and the third piping 116, the cleaning liquid and the purge gas can be delivered to wash and purge the portion 138 of the first piping 108, so that particles and/or crystals in the portion 138 of the first piping 108 can be effectively decreased. Thus, condense defects on the wafer 106 due to the dripping of the remnant liquid from the first piping 108 are greatly reduced, and dummy flush operations can be omitted or decreased.

Figure 2:
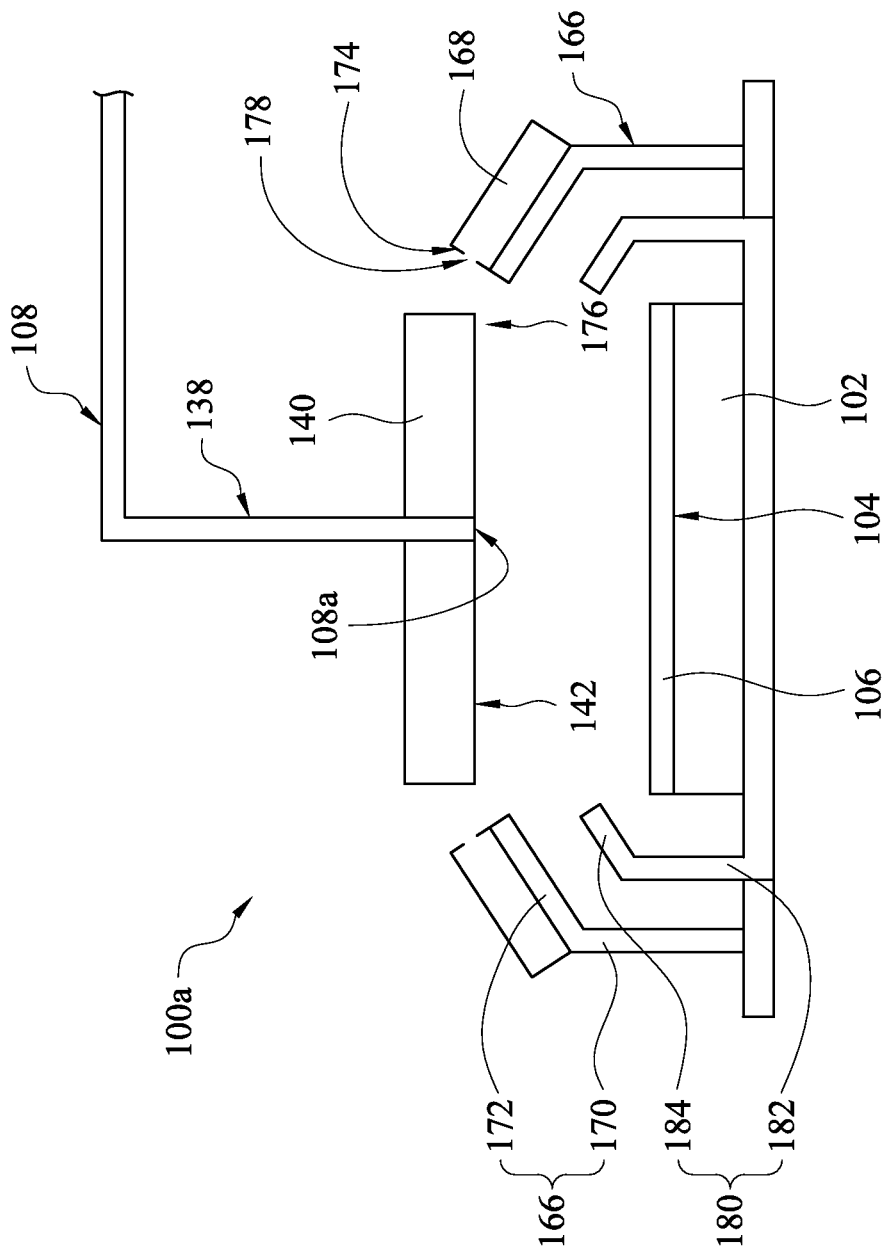

FIG. 2 is schematic diagram showing an apparatus in accordance with various embodiments. In some embodiments, an apparatus 100a is a wet processing apparatus, such as a phosphoric acid apparatus for a single wafer. The apparatus 100a disclosed herein is used as an example for explanation, and embodiments of the present disclosure are also applicable to other types of wet processing apparatuses. As shown in FIG. 2, the apparatus 200 includes a susceptor 102, a heating plate 140, a first piping 108, a cup 166 and a cleaning ring 168. The susceptor 102 is suitable for placing a wafer 106 on a surface 104 of the susceptor 102. In some examples, the susceptor 102 is a vacuum chuck which can firmly hold the wafer 106 by vacuum absorbing. In addition, the susceptor 102 is rotatable, and the wafer 106 can be rotated by the drive of the susceptor 102 during wet processing.

The heating plate 140 is disposed above the susceptor 102. The first piping 108 passes through the heating plate 140 and is configured to dispense a chemical, such as phosphoric acid, from the heating plate 140 to the wafer 106 on the susceptor 102. The heating plate 140 is configured to heat the chemical delivered by the first piping 108. For example, the first piping 106 has a dispensing opening 108a, and the dispensing opening 108a is in a bottom surface 142 of the heating plate 140 above the wafer 106 on the susceptor 102 for dispensing the chemical from the top of the wafer 106. When the chemical delivered by the first piping 108 flows through the heating plate 140, the chemical is heated by the heating plate 140. In some examples, the first piping 108 has a portion 138 passing through the heating plate 140, and the dispensing opening 108a is at one end of the portion 138. The portion 138 is a downward portion of the first piping 108, and the dispensing opening 108a is at the lower end of the portion 138. Thus, a fluid in the portion 138 flows downward and is drained out of the first piping 108 from the dispensing opening 108a.

The cup 166 encloses the susceptor 166 for preventing the chemical supplied from the first piping 108 and the reactants during the wet processing operation from being spun out so as not to contaminate the inner of the apparatus 100a. In some examples, the cup 166 includes a sidewall 170 and an annular inclined baffle 172 connected to a top of the sidewall 170. The cleaning ring 168 is disposed on the cup 166. In some exemplary examples, as shown in FIG. 2, the cleaning ring 168 is disposed on the annular inclined baffle 172, so that the cleaning ring 168 is inclined and a side surface 174 of the cleaning ring 168 is opposite to an edge 176 of the heating plate 140. The cleaning ring 168 has holes 178 in the side surface 174 for injecting a cleaning fluid toward the edge 176 of the heating plate 140 to wash the edge 176 which includes portions of the bottom surface and sidewall of the heating plate 140. Thus, the contaminants, and the crystals and the particles of the chemical remaining on the edge 176 of the heating plate 140 can be removed. In certain exemplary examples, the number of the holes 178 ranges from 50 to 100.

The cleaning ring 168 can inject cleaning fluid toward the edge 176 of the heating plate 140 to clean the edge 176 before the first one of wafers are wet processed in the apparatus 100a, so that the contaminants, and the crystals and the particles of the chemical remaining on the edge 176 can be washed out of the edge 176. Thus, the number of the particles dripping from the edge 176 onto edge portions of the wafers can be greatly decreased.

In some examples, the apparatus 100a further includes another cup 180 enclosing the susceptor 102, in which the cup 166 encloses the cup 180. The cup 180 is operable to prevent the chemical supplied from the first piping 108 and the reactants during the wet processing operation from being spun out so as not to contaminate the inner of the apparatus 100a. In addition, the cups 166 and 180 can be elevated and lowered, and the cups 166 and 180 are operable to retain different process reactants by adjusting the relative elevation between the cups 166 and 180. The cup 180 includes a sidewall 182 and an annular inclined baffle 184 connected to a top of the sidewall 182.

Referring to FIGS. 1 and 2 again, in some embodiments, the apparatus 100 includes a cup 166 and a cleaning ring 168 in the apparatus 100a, and the configurations of the cup 166 and the cleaning ring 168 in the apparatus 100 are the same with those in the apparatus 100a. Furthermore, the apparatus 100 may further include a cup 180 in the apparatus 100a, and the configuration of the cup 180 in the apparatus 100 is the same with that in the apparatus 100a. On the other hand, the apparatus 100a may include a second piping 112 and a liquid source 114, and/or a third piping 116 and a gas source 118 in the apparatus 100, and the configurations of the second piping 112, the liquid source 114, the third piping 116 and the gas source 118 in the apparatus 100a are the same with those in the apparatus 100. Moreover, the apparatus 100a may further include a chemical source 110, a circulating piping 120, an auxiliary piping 122, flow meters 124,126, 148 and 152, automatic valves 128 and 130, manual valves 132, 134, 146 and 150, a thermocouple 136, an orifice 144, a filter 154, a check valve 156 and/or a connecting piping 158, in which the configurations of these components in the apparatus 100a are the same with those in the apparatus 100.

Figure 3:
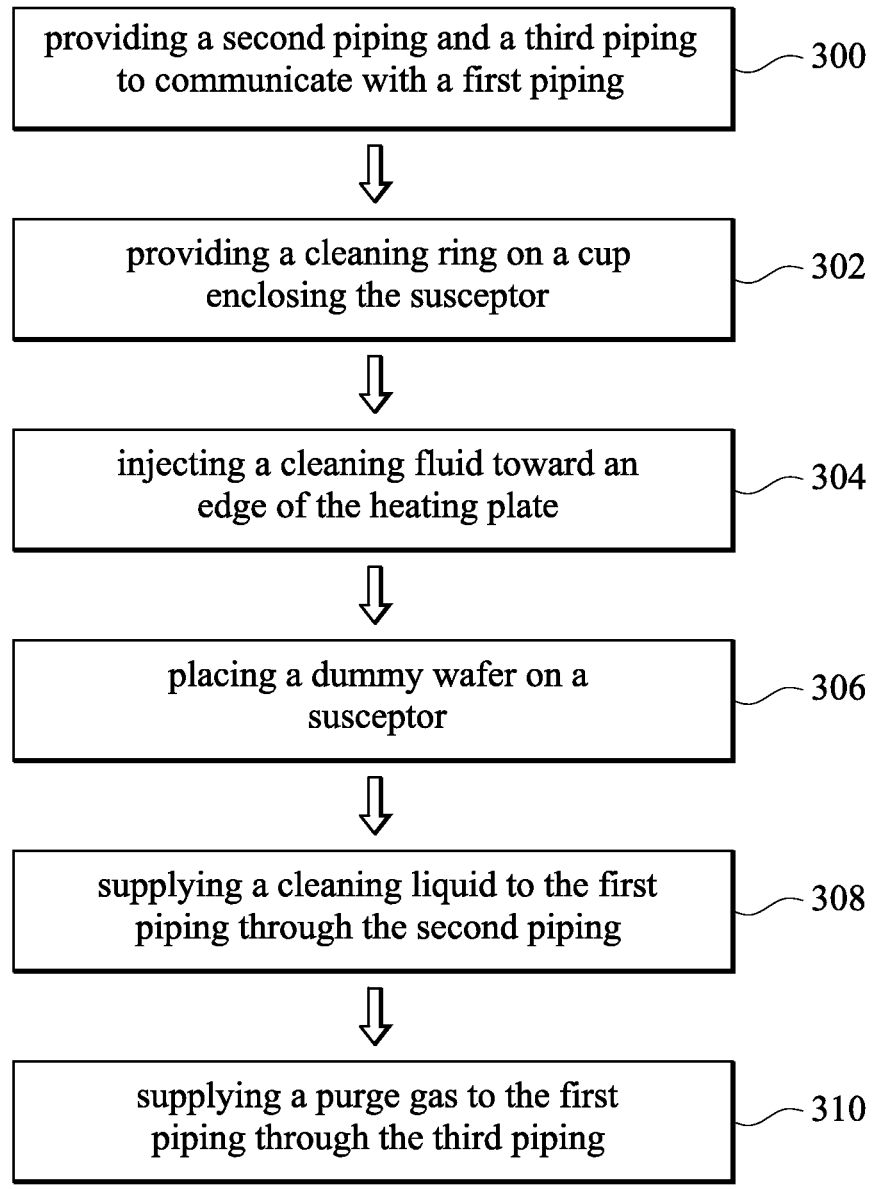

Referring to FIG. 3 with FIG. 1 and FIG. 2, FIG. 3 is a flow chart of a method in accordance with various embodiments. The method begins at operation 300, where a second piping 112 and a third piping 116 are provided. In the operation 300 of providing the second piping 112 and the third piping 116, the second piping 112 and the third piping 116 are provided to communicate with a first piping 108. The first piping 108 has a dispensing opening 108a, and the dispensing opening 108a is disposed above a wafer 106 on a susceptor 102 for dispensing a chemical such as phosphoric acid to the wafer 106. In some examples, the first piping 108 is configured to pass through a heating plate 104 above the susceptor 102, and to have the dispensing opening 108a in a bottom surface 142 of the heating plate 140. The heating plate 140 is operable to heat the chemical delivered by the first piping 108. In certain examples, the first piping 108 is provided to have a portion 138 which has the dispensing opening 108a at one end of the portion 138. The first piping 108 is configured to have the portion 138 downward and pass through the heating plate 140, and to form the dispensing opening 108a at the lower end of the portion 138.

In various examples, a chemical source 110 is provided to communicate with the first piping 108 to deliver the chemical to the first piping 108. The operation 300 is performed to further provide a liquid source 114 and a gas source 118 to respectively communicate with the second piping 112 and the third piping 116. The liquid source 114 is configured to deliver a cleaning liquid to the second piping 112 while the gas source 118 is configured to flow a purge gas to the third piping 116.

In some embodiments, when the idle time of the apparatus 100 does not exceed a predetermined period of time, a pre-shot dummy procedure is directly performed. In the pre-shot dummy procedure, an operation 306 is performed to place a dummy wafer such as the wafer 106 on a surface 104 of the susceptor 102 before delivering the chemical in the first piping 108. In certain embodiments, when the idle time of the apparatus 100 exceeds the predetermined period of time, a dummy flush procedure is performed before the operation 306. Operations 302 and 304 are included in the dummy flush procedure, so that the operations 302 and 304 are performed before the operation 306.

At operation 302, as shown in FIG. 2, a cup 166 and a cleaning ring 168 are provided, in which the cup 166 is provided to enclose the susceptor 102, and the cleaning ring 168 is disposed on the cup 166. The operation of providing the cleaning ring 168 is to provide the cleaning ring 168 having holes 178 in a side surface 174 of the cleaning ring 168 opposite to an edge 176 of the heating plate 140. At operation 304, when the dummy flush procedure is performed to wash the inner of the apparatus 100a using water, a cleaning fluid is injected toward the edge 176 of the heating plate 140 through the holes 178 of the cleaning ring 168 to wash the edge 176, so as to remove the contaminants, and the crystals and the particles of the chemical remaining on the edge 176.

At operation 308, as shown in FIG. 1, after the dummy wafer 106 is placed on the susceptor 102, a cleaning liquid is supplied to the second piping 112 by the liquid source 114, and is further delivered to the first piping 108 through the second piping 112 to wash the first piping 108. In some examples, the cleaning liquid is directly delivered to the portion 138 of the first piping 108 to wash the portion 138. In certain exemplary examples, the operation of supplying the cleaning liquid is performed to supply hot deionized water. The cleaning liquid may dissolve and/or degrade the contaminants and/or the crystals of the chemical adhered to the inner of the portion 138 of the first piping 108, so as to reduce the adhesion and the structure strength of the contaminants and/or the crystals of the chemical.

At operation 310, a purge gas is supplied to the third piping 116 by the gas source 118, and further flows to the first piping 108 through the third piping 116 to purge the first piping 108. In some examples, the purge gas is directly delivered to the washed portion 138 of the first piping 108 to purge the portion 138. In certain exemplary examples, the operation of supplying the purge gas is performed to supply nitrogen. The purge gas can blow off the dissolved or degraded contaminants and/or the crystals of the chemical adhered to the inner of the portion 138 of the first piping 108, so as to effectively remove the contaminants and/or the crystals of the chemical from the inner of the portion 138.

By using the cleaning liquid to wash the portion 138 of the first piping 108 and using the purge gas to purge the portion 138, only one dummy wafer is needed in the pre-treatment procedure of the apparatus 100. Compared with a typical pre-treatment procedure which needs at least five pieces of dummy wafers, the methods of the present embodiments are economical and time saving. Moreover, the portion 138 of the first piping 108 and the edge of the heating plate 140 are washed, so that the numbers of particles remaining on center portions and edge portions of the wafers 106 are greatly decreased.

In accordance with an embodiment, the present disclosure discloses an apparatus includes a susceptor, a first piping, a second piping, a liquid source, a third piping and a gas source. The susceptor is suitable for placing a wafer, and the first piping is configured to dispense a chemical to the wafer on the susceptor. The second piping communicates with the first piping. The liquid source is configured to deliver a cleaning liquid to the first piping through the second piping to wash a portion of the first piping. The third piping communicates with the first piping. The gas source is configured to flow a purge gas to the first piping through the third piping to purge the portion of the first piping.

In accordance with another embodiment, the present disclosure discloses an apparatus including a susceptor, a heating plate, a first piping, a cup and a cleaning ring. The susceptor is suitable for placing a wafer. The heating plate is disposed above the susceptor. The first piping passes through the heating plate and is configured to dispense a chemical from the heating plate to the wafer on the susceptor. The cup encloses the susceptor. The cleaning ring is disposed on the cup, in which the cleaning ring has holes for injecting a cleaning fluid toward an edge of the heating plate.

In accordance with yet another embodiment, the present disclosure discloses a method. In this method, a second piping and a third piping are provided to communicate with a first piping, in which the first piping is configured for dispensing a chemical. A dummy wafer is placed on a susceptor. A cleaning liquid is supplied to the first piping through the second piping to wash a portion of the first piping. A purge gas is supplied to the first piping through the third piping to purge the portion of the first piping.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An apparatus, comprising:
 a susceptor for placing a wafer;
 a chemical source;
 a first piping connected to the chemical source, wherein the chemical source is configured to deliver a chemical to the first piping, and the first piping is configured to dispense the chemical to the wafer on the susceptor;
 a second piping connected to the first piping;
 a liquid source configured to deliver a cleaning liquid to the first piping through the second piping to wash a portion of the first piping;

a third piping connected to the first piping;

a gas source configured to flow a purge gas to the first piping through the third piping to purge the portion of the first piping;

a circulating piping configured to re-circulate the chemical, wherein two ends of the circulating piping are respectively connected to the first piping and the chemical source; and an auxiliary piping configured to replenish a flow rate of the chemical in the circulating piping, wherein two ends of the auxiliary piping are respectively connected to the first piping and the circulating piping.

2. The apparatus of claim 1, wherein a dispensing opening of the first piping is at one end of the portion of the first piping, and the portion of the first piping is a downward portion.

3. The apparatus of claim 1, further comprising a heating plate above the susceptor, wherein the portion of the first piping passes through the heating plate and a dispensing opening of the first piping is in a bottom surface of the heating plate.

4. The apparatus of claim 3, wherein the second piping and the third piping are connected to the first piping at a pinning point of the first piping located above the heating plate, and a distance between the pinning point and a top of the heating plate ranges from 350 mm to 400 mm.

5. The apparatus of claim 3, further comprising:

a first cup enclosing the susceptor and comprising a first sidewall and a first annular inclined baffle connected to a top of the first sidewall; and a cleaning ring on the first annular inclined baffle, wherein the cleaning ring has a plurality of holes for injecting a cleaning fluid toward an edge of the heating plate.

6. The apparatus of claim 5, wherein the number of the plurality of holes ranges from 50 to 100.

7. The apparatus of claim 5, further comprising a second cup enclosing the susceptor and comprising a second sidewall and a second annular inclined baffle connected to a top of the second sidewall, wherein the first cup encloses the second cup.

8. The apparatus of claim 1, further comprising:

a first valve disposed on the circulating piping;

a second valve disposed on the first piping, wherein the second valve is located between the end of the circulating piping connected to the first piping and the end of the auxiliary piping connected to the first piping;

a third valve disposed on the first piping; and a fourth valve disposed on the auxiliary piping, wherein the end of the auxiliary piping connected to the first piping is located between the third valve and the second valve.

9. An apparatus, comprising:

a susceptor for placing a wafer;

a heating plate above the susceptor;

a chemical source;

a first piping passing through the heating plate and connected to the chemical source, wherein the chemical source is configured to deliver a chemical to the first piping, and the first piping is configured to dispense the chemical from the heating plate to the wafer on the susceptor;

a first cup enclosing the susceptor;

a cleaning ring on the first cup, wherein the cleaning ring has a plurality of holes for injecting a cleaning fluid toward an edge of the heating plate;

a circulating piping configured to re-circulate the chemical, wherein two ends of the circulating piping are respectively connected to the first piping and the chemical source; and an auxiliary piping configured to replenish a flow rate of the chemical in the circulating piping, wherein two ends of the auxiliary piping are respectively connected to the first piping and the circulating piping.

10. The apparatus of claim 9, wherein the first cup comprises a sidewall and an annular inclined baffle connected to a top of the sidewall, and the cleaning ring is disposed on the annular inclined baffle.

11. The apparatus of claim 9, wherein the number of the plurality of holes ranges from 50 to 100.

12. The apparatus of claim 9, further comprising:

a second piping connected to the first piping; and a liquid source configured to deliver a cleaning liquid to the first piping through the second piping to wash a portion of the first piping.

13. The apparatus of claim 12, further comprising:

a third piping connected to the first piping; and a gas source configured to deliver a purge gas to the first piping through the third piping so as to purge the portion of the first piping.

14. The apparatus of claim 13, wherein the portion of the first piping passes through the heating plate and a dispensing opening of the first piping is in a bottom surface of the heating plate.

15. The apparatus of claim 13, wherein the second piping and the third piping are connected to the first piping at a pinning point of the first piping located above the heating plate, and a distance between the pinning point and a top of the heating plate ranges from 350 mm to 400 mm.

16. The apparatus of claim 13, wherein a dispensing opening of the first piping is at one end of the portion of the first piping, and the portion of the first piping is a downward portion.

17. The apparatus of claim 9, further comprising a second cup enclosing the susceptor and comprising a sidewall and an annular inclined baffle connected to a top of the sidewall, wherein the first cup encloses the second cup.

* * * * *